US012796423B2

(12) United States Patent
Noma et al.

(10) Patent No.: US 12,796,423 B2
(45) Date of Patent: Nov. 10, 2026

(54) ELECTROLESS PLATING METHODS

(71) Applicant: SEMICONDUCTOR COMPONENTS INDUSTRIES, LLC, Scottsdale, AZ (US)

(72) Inventors: Takashi Noma, Ota (JP); Shinzo Ishibe, Oizumi-machi (JP)

(73) Assignee: SEMICONDUCTOR COMPONENTS IDUSTRIES, LLC, Scottsdale, AZ (US)

(*) Notice: Subject to any disclaimer, the term of this patent is extended or adjusted under 35 U.S.C. 154(b) by 387 days.

(21) Appl. No.: 18/492,867

(22) Filed: Oct. 24, 2023

(65) Prior Publication Data

US 2024/0404879 A1 Dec. 5, 2024

Related U.S. Application Data

(60) Provisional application No. 63/505,612, filed on Jun. 1, 2023.

(51) Int. Cl.

| | |
|---|---|
| ***H10W 20/00*** | (2026.01) |
| ***C23C 18/30*** | (2006.01) |
| ***C23C 18/42*** | (2006.01) |
| ***H10P 72/70*** | (2026.01) |

(52) U.S. Cl.

CPC ........... *H10W 20/044* (2026.01); *C23C 18/30* (2013.01); *C23C 18/42* (2013.01); *H10P 72/7402* (2026.01)

(58) Field of Classification Search

CPC ...... H10W 20/044; C23C 18/30; C23C 18/42; C23C 18/1642; C23C 18/1605; H10P 72/7402; H10P 14/46

See application file for complete search history.

(56) References Cited

U.S. PATENT DOCUMENTS

| | | | | |
|---|---|---|---|---|
| 9,136,047 | B2 | 9/2015 | Song et al. | |
| 9,437,668 | B1 * | 9/2016 | Deligianni | H10D 1/20 |
| 2004/0009631 | A1 * | 1/2004 | Connell | H10W 74/014 257/E23.129 |
| 2013/0299450 | A1 * | 11/2013 | Song | H10D 86/60 216/13 |
| 2019/0148306 | A1 * | 5/2019 | Lin | H10W 20/4403 438/530 |
| 2021/0223489 | A1 * | 7/2021 | Weng | G02B 6/4253 |
| 2022/0157749 | A1 * | 5/2022 | Spory | H10W 72/019 |
| 2022/0359230 | A1 * | 11/2022 | Wirz | H10W 74/01 |

FOREIGN PATENT DOCUMENTS

WO 2015083662 A1 6/2015

OTHER PUBLICATIONS

European Search Report (Partial), EP24162033, European Patent Office, Sep. 4, 2024.

* cited by examiner

*Primary Examiner* — S M Sohel Imtiaz

(74) *Attorney, Agent, or Firm* — IPTechLaw

(57) ABSTRACT

Implementations of a method of electroless deposition may include providing a semiconductor substrate including a first largest planar surface and a second largest planar surface; forming a backmetal layer on the second largest planar surface; attaching a tape over the backmetal layer; and electroless depositing a metal layer on a pad included on the first largest planar surface. The method may include, after electroless depositing, removing the tape; and after removing the tape, baking the semiconductor substrate.

11 Claims, 6 Drawing Sheets

ELECTROLESS PLATING METHODS

CROSS REFERENCE TO RELATED APPLICATIONS

This document claims the benefit of the filing date of U.S. Provisional Patent Application 63/505,612, entitled "Electroless Metal Plating Semiconductor Device" to Noma et al., which was filed on Jun. 1, 2023, the disclosure of which is hereby incorporated entirely herein by reference.

BACKGROUND

1. Technical Field

Aspects of this document relate generally to semiconductor device manufacturing processes such as plating of metals. More specific implementations involve electroless metal plating systems and methods.

2. Background

Semiconductor devices utilize semiconductor packages to establish electrical connections with circuit boards or mother boards to which the semiconductor packages are coupled. Various semiconductor package designs have been devised that allow for protection of the associated semiconductor devices from humidity or shock and vibration.

SUMMARY

Implementations of a method of electroless deposition may include providing a semiconductor substrate including a first largest planar surface and a second largest planar surface; forming a backmetal layer on the second largest planar surface; attaching a tape over the backmetal layer; and electroless depositing a metal layer on a pad included on the first largest planar surface. The method may include, after electroless depositing, removing the tape; and after removing the tape, baking the semiconductor substrate.

Implementations of a method of electroless deposition may include one, all, or any of the following:

The method may include singulating the semiconductor substrate to form a plurality of semiconductor die.

The semiconductor substrate may include silicon carbide.

The metal layer may include one of nickel, palladium, and gold; nickel and copper, or copper.

Baking the semiconductor substrate further may include heating from ambient temperature to between 150 C to 350 C at a temperature ramp of less than or equal to 3 C per minute.

The method may include removing the semiconductor substrate from an oven performing the baking when the semiconductor substrate may have cooled to less than 50 C.

Baking the semiconductor substrate further may include heating in a nitrogen atmosphere.

Implementations of a method of electroless deposition may include providing a semiconductor substrate; electroless depositing a metal layer on a pad included on a largest planar surface of the semiconductor substrate; and after electroless depositing, baking the semiconductor substrate.

Implementations of a method of electroless deposition may include one, all, or any of the following:

The method may include singulating the semiconductor substrate to form a plurality of semiconductor die.

The semiconductor substrate may include silicon carbide.

The metal layer may include one of nickel, palladium, and gold; nickel and copper, or copper.

Baking the semiconductor substrate further may include heating from ambient temperature to between 150 C to 350 C at a temperature ramp of less than or equal to 3 C per minute.

The method may include removing the semiconductor substrate from an oven performing the baking when the semiconductor substrate may have cooled to less than 50 C.

Baking the semiconductor substrate further may include heating in a nitrogen atmosphere.

Implementations of a method of electroless deposition may include providing a semiconductor substrate including a first largest planar surface and a second largest planar surface; coupling a carrier to the first largest planar surface; thinning the semiconductor substrate from the second largest planar surface to form an edge ring; and forming a backmetal layer on the second largest planar surface. The method may include demounting the carrier from the first largest planar surface; electroless depositing a metal layer on a pad included on the first largest planar surface and on the backmetal layer; and baking the semiconductor substrate.

Implementations of a method of electroless deposition may include one, all, or any of the following:

The method may include mounting the semiconductor substrate to a cutting tape, removing the edge ring, and singulating the semiconductor substrate to form a plurality of semiconductor die.

The semiconductor substrate may include silicon carbide.

The metal layer may include one of nickel, palladium and gold; nickel and copper, or copper.

Baking the semiconductor substrate further may include heating from ambient temperature to between 150 C to 350 C at a temperature ramp of less than or equal to 3 C per minute in a nitrogen atmosphere.

The method may include removing the semiconductor substrate from an oven performing the baking when the semiconductor substrate may have cooled to less than 50 C.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended methods of electroless deposition will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such electroless deposition, and implementing components and methods, consistent with the intended operation and methods.

Figure 1:
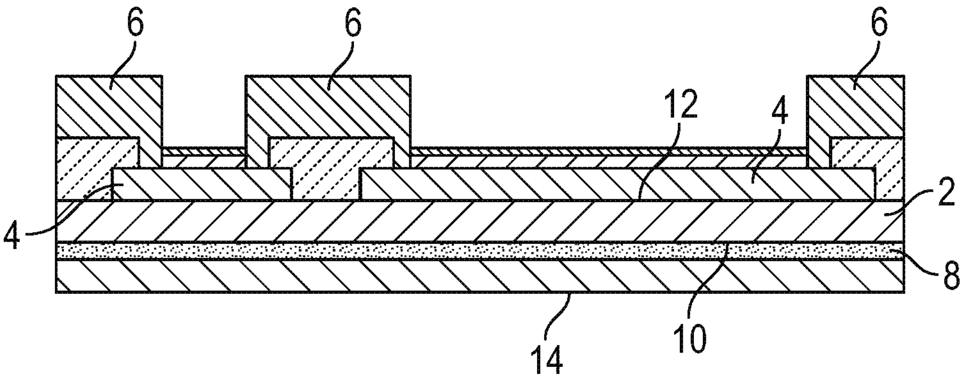
FIG. 1 is a cross sectional view of an implementation of a first semiconductor substrate.

Referring to FIG. 1, an implementation of a cross sectional view of a portion of a semiconductor substrate 2 is illustrated at a point in the fabrication process. While a portion of the semiconductor substrate 2 is illustrated, it is understood that the particular structures illustrated in cross section in FIG. 1 can be repeated in various semiconductor die across the entire surface of the semiconductor substrate for a plurality of semiconductor devices/die included in the semiconductor substrate. The semiconductor substrate 2 may be a silicon carbide substrate in various method implementations. The semiconductor substrate could also be any of a wide variety of semiconductor material types, including, by non-limiting example, silicon, silicon on insulator, ruby, sapphire, gallium arsenide, gallium nitride, or any other semiconductor material type. Here the semiconductor wafer has had semiconductor devices formed therein and various layers of material have subsequently been formed as part of the finishing process prior to singulation of the semiconductor devices for processing during packaging operations. In the implementation illustrated in FIG. 1, aluminum pads 4 is illustrated surrounded by passivation material 6 (nitride, polyimide, etc.) formed on the front side or first largest planar side 12 of the semiconductor substrate 2. A backmetal layer 8 of aluminum is illustrated formed on the back side or second largest planar side 10 of the semiconductor substrate 2. A protective tape 14 is illustrated coupled over the aluminum to prevent deposition of other metals thereon.

Figure 2:
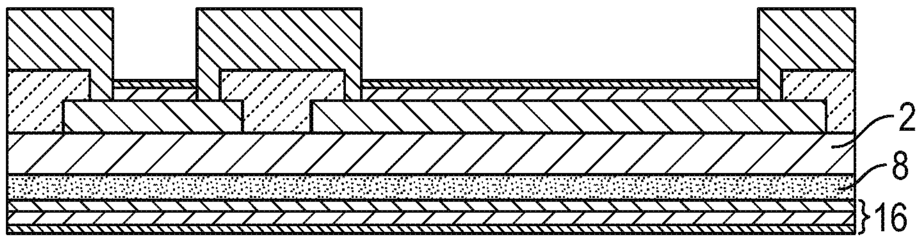
FIG. 2 is a cross sectional view of the semiconductor substrate of FIG. 1 following formation of a backmetal layer.

The semiconductor substrate implementation of FIG. 1 is illustrated following electroless plating of a topside metallization that in this implementation is various layers of nickel, palladium, and gold using an electroless deposition process referred to as electroless nickel electroless palladium immersion gold (ENEPIG). This process forms a metal layer that includes a layer of nickel, a layer of palladium, and a layer of gold. In this and other implementations disclosed herein, however, other metals may be electrolessly deposited together or in layers on the topside and/or the backside including, by non-limiting example, nickel and copper; copper; palladium; gold; nickel and palladium; nickel and gold; copper, nickel, and gold; copper, nickel, palladium, and gold; any combination thereof, or any other electrolessly platable metal onto the surface of the pad or subsequently plated layers. FIG. 2 illustrates the semiconductor substrate 2 following deposition of an additional backmetal layer 16 of titanium, nickel, vanadium, and silver thereon after removal of the tape 14 from the backmetal layer 8. In some implementations, the additional backmetal layer 16 may be electroless deposited or may be deposited using another process such as sputtering or electroplating.

Figure 3:
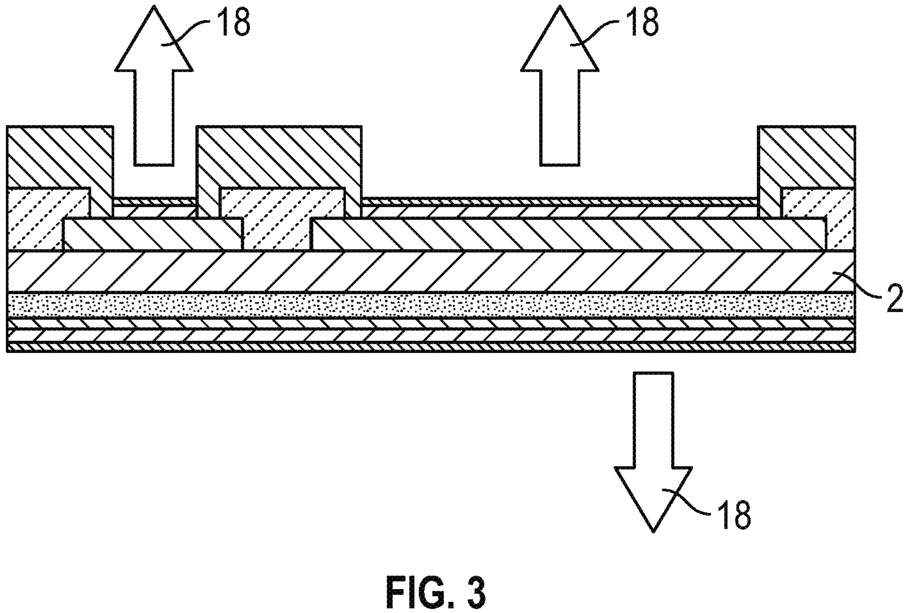
FIG. 3 is a cross sectional view of the semiconductor substrate of FIG. 2 during a baking operation.

Referring to FIG. 3, the semiconductor substrate of FIG. 2 is illustrated during a baking operation/process carried out using an oven or other thermal heating device capable of enclosing the semiconductor substrate. As illustrated, during the backing operation, outgassing of remaining electroplating chemicals is occurring as indicated by arrows 18. In various implementations, during baking in the oven a substantially oxygen free atmosphere (less than 20 ppm oxygen) is maintained using nitrogen gas. In some implementations during baking, the atmosphere in the oven is quiescent and in others, the atmosphere in the oven is drawn off, changed, or cycled as in a convective heating process.

During the baking operation, in various method implementations, the temperature is ramped up from ambient temperature to 250 C at a rate of 3 C per minute. In other method implementations, however, the maximum temperature may range between 150 C and 300 C. In various method implementations, the bake time at the highest temperature point may be about 15 minutes. In various method implementations, after reaching the highest temperature in the bake, the semiconductor substrate 2 is then cooled using a cooling rate substantially the same as the heating rate until reaching under 50 C. The heating and cooling rates and removal of the semiconductor substrate at less than 50 C work to help reduce/prevent oxidation of the various metal layers on the semiconductor substrate 2. The maximum bake temperature and time spent at the maximum bake temperature can help improve voiding and avoid phase shifts of one or more of the metal layers. For example, where the maximum bake temperature is 250 C, the issue of shifting of the phase of a nickel layer is avoided.

The foregoing baking process following electroless deposition of a metal layer on the semiconductor substrate can be used with a wide variety of electrolessly plated layers including, by non-limiting example, titanium nickel vanadium silver (TiNiVAg), copper, copper nickel gold (CuNiAu), aluminum, tin, tin alloys, or nickel. During or after the baking process additional protective layer(s) can be applied over the electrolessly plating layers including, by non-limiting example, nickel gold, nickel palladium, palladium, tin, tin palladium, a solder, an organic material, an organic solderability preservative, or any combination thereof. The protective layer(s) may be deposited by electroplating, sputtering, evaporation, screen printing, spin on coating, or other deposition processes consistent with the particular materials used. The baking process can be used with semiconductor substrates of a wide variety of thicknesses including thinned wafers (less than 125 microns thick). A wide variety of semiconductor device types may be processed using the baking process including, by non-limiting example, silicon carbide devices, gallium nitride devices, insulated gate bipolar transistors (IGBITs), metal-oxide field effect transistors (MOSFETs), or any other semiconductor device type. Where thinned semiconductor substrates are employed, as described further herein, the wafers may be background, lapped, or polished using a carrier or support or thinned in a process that forms an edge ring. A wide variety of backmetal metallizations may be employed in the various method implementations disclosed herein, including, by non-limiting example, aluminum, titanium nickel vanadium silver, nickel palladium gold, copper, nickel, any combination thereof, or any other desired metal material.

A wide variety of method implementations involving a baking process/operation may be created using the principles disclosed herein. Various implementations are disclosed in this document purely for the exemplary purposes of this disclosure.

Figure 4:
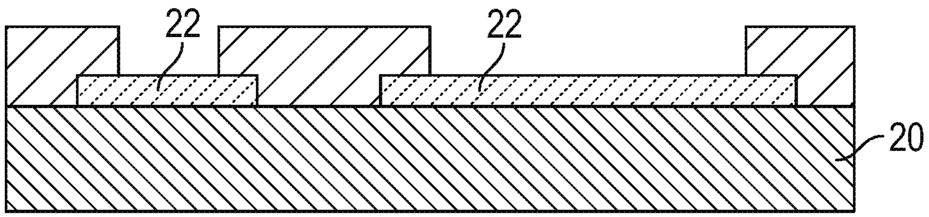
FIG. 4 is a cross sectional view of a second semiconductor substrate.

Referring to FIG. 4, an implementation of a semiconductor substrate 20 is illustrated with aluminum pads 22 formed thereon. The semiconductor substrate type used in this implementation may be any disclosed in this document. While the use of aluminum in the pads 22 is illustrated in the implementation of FIG. 4, any of a wide variety of pad metallizations could be employed in various implementations with various other overpad metals including, by non-limiting example, copper, aluminum copper, aluminum silicon, silver, gold, any combination thereof, or any other pad metallization type.

Figure 5:
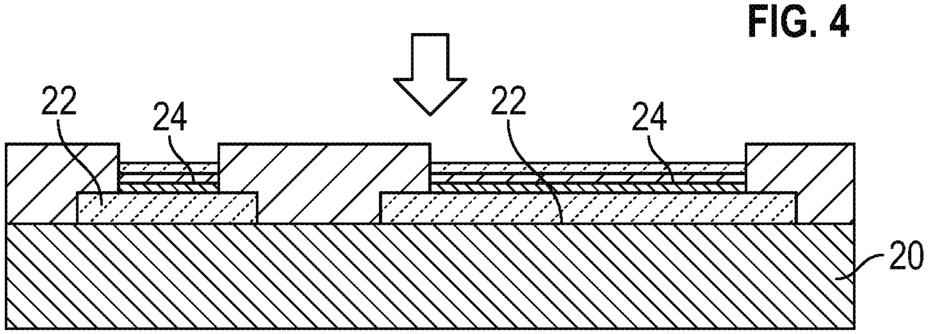
FIG. 5 is a cross sectional view of the semiconductor substrate of FIG. 4 following electroless deposition on a top side.

Referring to FIG. 5, the semiconductor substrate 20 is illustrated following electroless deposition of a metal layer 24 over the pads 22. Here the metal layer 24 includes three different layers of material in the case of nickel palladium gold or copper nickel gold. However, in various implementations, the metal layer 24 may be any electrolessly deposited metal layer disclosed herein and may be protected using any protective layer type disclosed herein in various method implementations. In such implementations, the method may include forming/applying the protective layer either after or prior to a baking operation.

Figure 6:
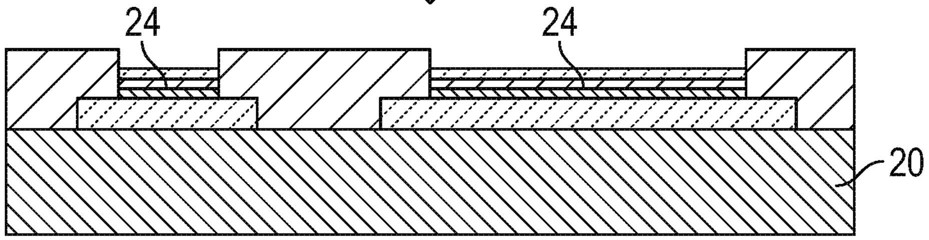
FIG. 6 is a cross sectional view of the semiconductor substrate of FIG. 5 following a baking process.
Figure 7:
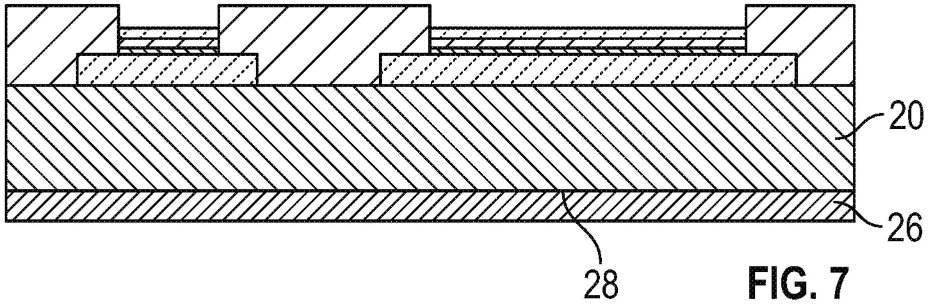
FIG. 7 is a cross sectional view of the semiconductor substrate of FIG. 6 following formation of a back metal layer.
Figure 8:
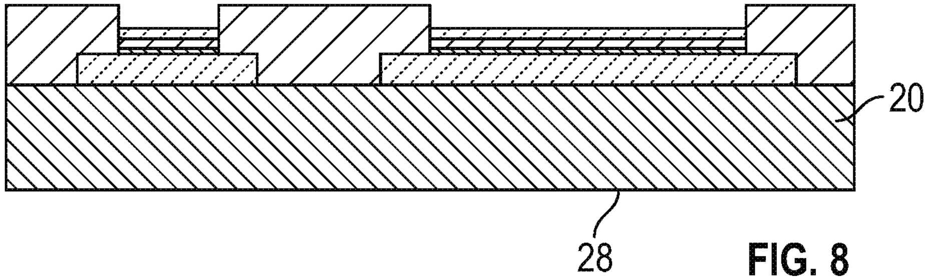
FIG. 8 is a cross sectional view of the semiconductor substrate of FIG. 6 prepared for subsequent thinning operations.

Referring to FIG. 6, the semiconductor substrate 20 is illustrated following a baking process for the metal layer 24 that is used to drive off/outgas the remaining plating chemicals from the electroless deposition operation. The baking process in this implementation may be any disclosed in this document. Following the baking step, FIG. 7 illustrates the semiconductor substrate 20 following application of a back metal layer 26 to a second largest planar surface 28. This backmetal layer 26 may be any disclosed in this document. Where the backmetal layer is applied using an electroless deposition process, the sequence of the baking process may be changed to take place after the application of the backmetal layer if degassing/removal of plating chemicals is desired from the backmetal layer. In some method implementations, no backmetal layer may be formed. Because the semiconductor substrate 20 in FIGS. 4-6 does not have a backmetal layer formed thereon, no protective measures like a tape coating of the second largest planar side 28 are employed during the electroless deposition process. FIG. 8 illustrates the semiconductor substrate 20 where no backmetal has been applied where the second largest planar surface 28 remains exposed.

Where no backmetal has been applied as in FIG. 8, additional substrate thinning operations can be carried out using a carrier or edge ring process to thin the semiconductor substrate 20. Following thinning, backmetal can then be added to the thinned semiconductor substrate 20 which may be any backmetal layer type disclosed herein.

Following the processes illustrated in FIGS. 4-7 or 4-6 and 8, the method implementations include singulating the semiconductor substate into a plurality of semiconductor die. The singulating may take place using any of a wide variety of singulation method including, by non-limiting example, sawing, lasering, water jet cutting, scribing, breaking, plasma etching, wet etching, any combination thereof, or any other method of separating the semiconductor material. In various method implementations and in the other method implementations disclosed in this document, the use of probing operations prior to singulation may be utilized as are the use of pick and place/tape reel die sort operations following singulations to prepare the semiconductor die for further packaging/assembly/testing processes.

Figure 9:
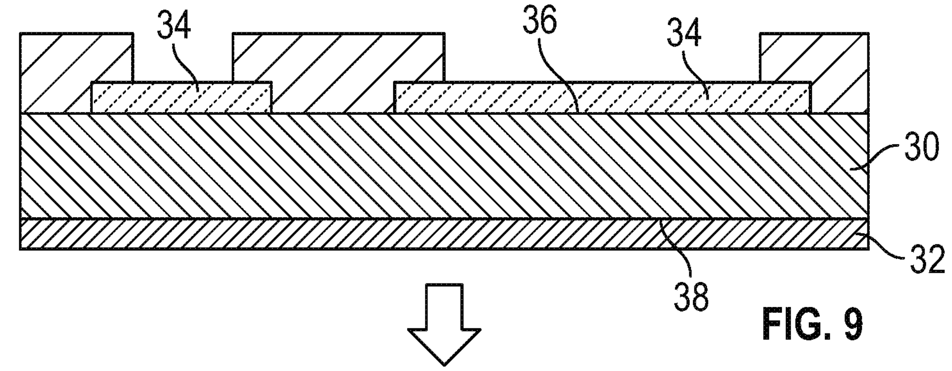
FIG. 9 is a cross sectional view of a third semiconductor substrate.
Figure 10:
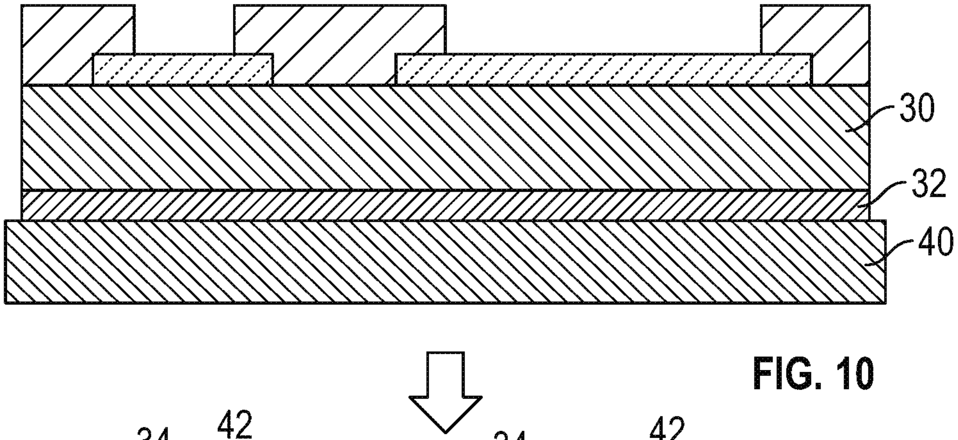
FIG. 10 is a cross sectional view of the semiconductor substrate of FIG. 9 following application of a tape to the back side of the semiconductor substrate.
Figure 11:
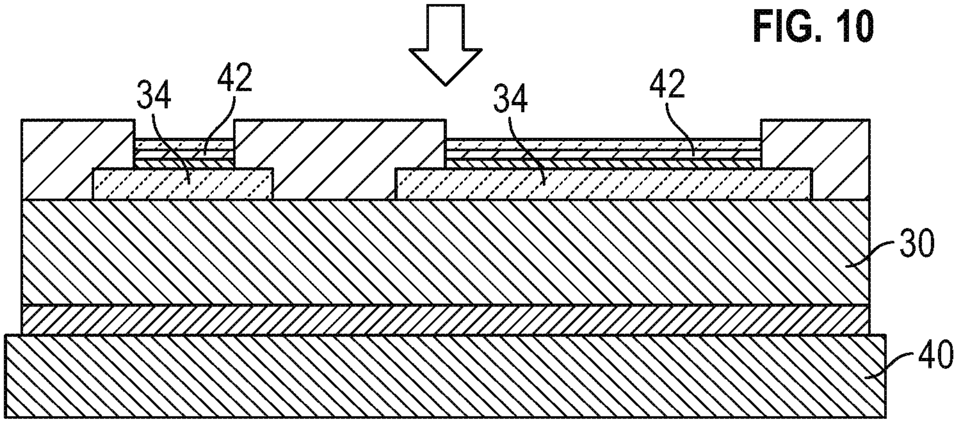
FIG. 11 is a cross sectional view of the semiconductor substrate of FIG. 10 following an electroless deposition process.
Figure 12:
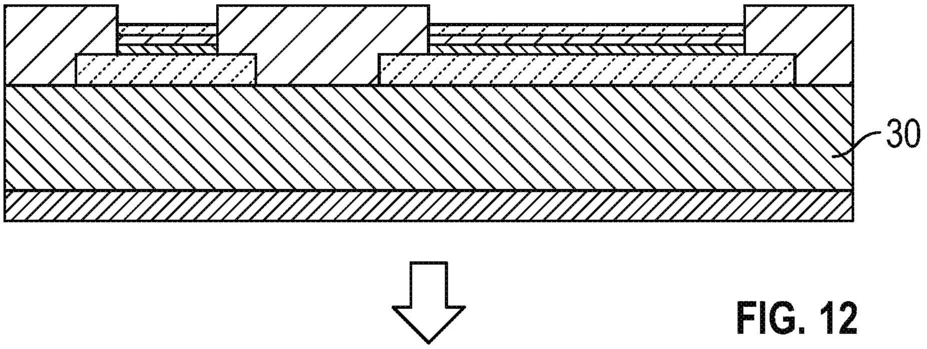
FIG. 12 is a cross sectional view of the semiconductor substrate of FIG. 11 following removal of the tape.
Figure 13:
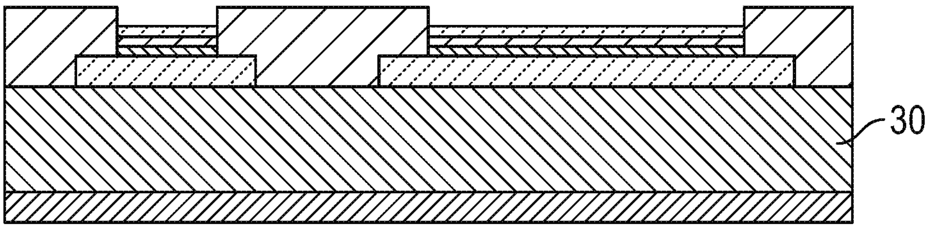
FIG. 13 is a cross sectional view of the semiconductor substrate of FIG. 12 following a baking process.

Referring to FIG. 9, an implementation of a semiconductor substrate 30 is illustrated following formation of a backmetal layer 32 on a second largest planar surface 38 and pads 34 on a first largest planar surface 36. Because the backmetal layer 32 is present, if additional metal layers are to be deposited, to avoid depositing them on the backmetal layer, tape 40 is applied as illustrated in FIG. 10. With the tape 40 in place, the method includes electroless depositing metal layer 42 over the pads 34. FIG. 11 illustrates the semiconductor substrate 30 following the electroless deposition process. The metal layer 42 may be any electrolessly deposited layer disclosed in this document in various method implementations as the pads may be any pad type disclosed herein. Following the electroless deposition, the tape 40 is removed and the semiconductor substrate 30 appears as illustrated in FIG. 12. The resulting semiconductor substrate 30 is then baked using any of the baking processes disclosed herein as illustrated in FIG. 13 which shows the semiconductor substrate 30 following the baking and now ready for singulation using any singulation process disclosed herein. Because the backmetal was applied prior to the electroless deposition process, any thinning of the semiconductor substrate 30 took place prior to the formation/application of the backmetal layer 32 in this method implementations.

Figure 14:
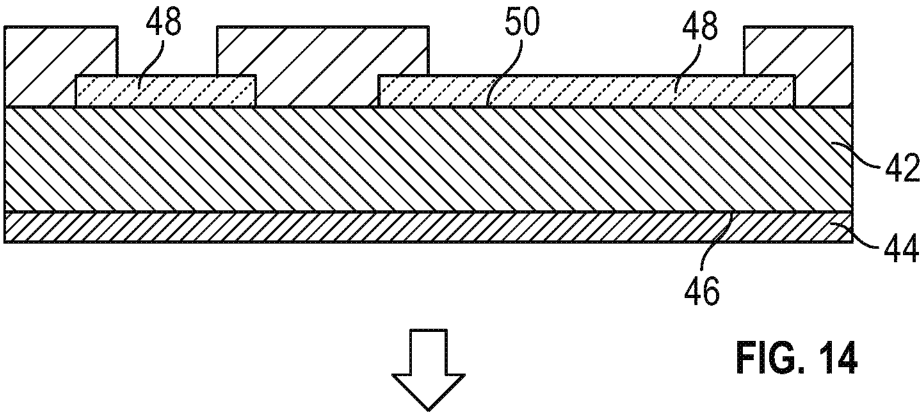
FIG. 14 is a cross sectional view of the semiconductor substrate of FIG. 13 ready for processing with various additional processes prior to electroless deposition.
Figure 15:
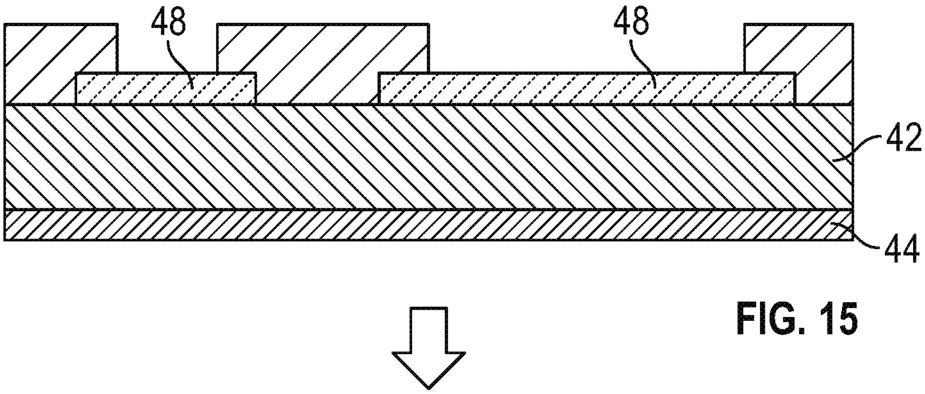
FIG. 15 is a cross sectional view of the semiconductor substrate of FIG. 14 following completion of additional preparation processes prior to electroless deposition.

Other method implementations may employ backside metal layers but not protect the backside metal layers during the electroless processing operation. Referring to FIG. 14, a semiconductor substrate 42 is illustrated that has backmetal layer 44 applied to second largest planar surface 46 and pads 48 formed on first largest planar surface 50. The backmetal in this implementation is aluminum copper. Because this semiconductor substrate 42 has the backmetal layer 44 applied, any thinning operation has already been completed. In this method implementation, a wafer preclean process is employed, followed by a backmetal annealing process, and then a two-side ashing process to prepare the pads 48 and the backmetal layer 44 for electroless deposition. The resulting semiconductor substrate 42 is illustrated in FIG. 15.

Figure 16:
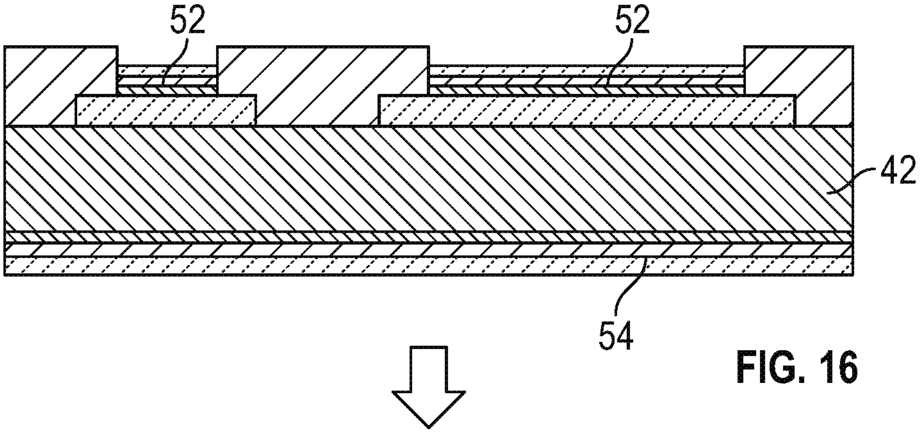
FIG. 16 is a cross sectional view of the semiconductor substrate of FIG. 15 following dual sided electroless deposition.

FIG. 16 illustrates the semiconductor substrate 42 following dual sided electroless deposition of metal layers 52, 54 on to pads 48 and backmetal layer 44, respectively. In the implementation illustrated in FIG. 16, the metal layers include three metal layers as in the nickel palladium gold or copper nickel gold metallizations. However, any of the metal layer implementations disclosed herein compatible with electroless deposition onto the material of the pads 48 and backmetal layer 44 may be utilized in various method implementations.

Figure 17:
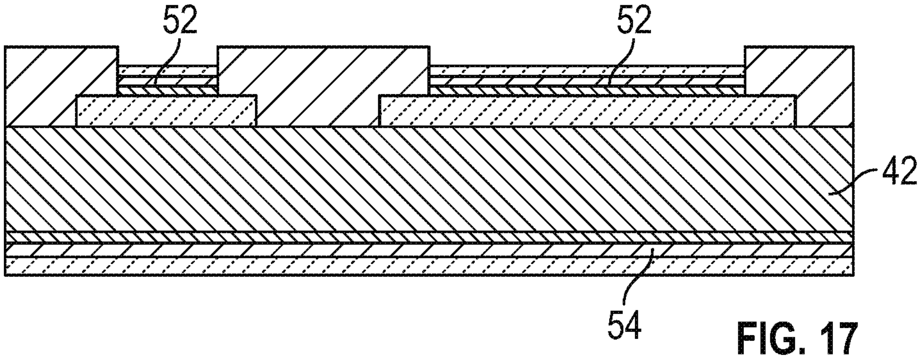
FIG. 17 is a cross sectional view of the semiconductor substrate of FIG. 16 following a baking process.

FIG. 17 illustrates the semiconductor substrate 42 following the baking process used to drive off the plating chemicals from the metal layers 52, 54 on both sides of the substrate. At this point, the semiconductor substrate 42 is ready for subsequent singulation operations like any disclosed in this document.

Figure 18:
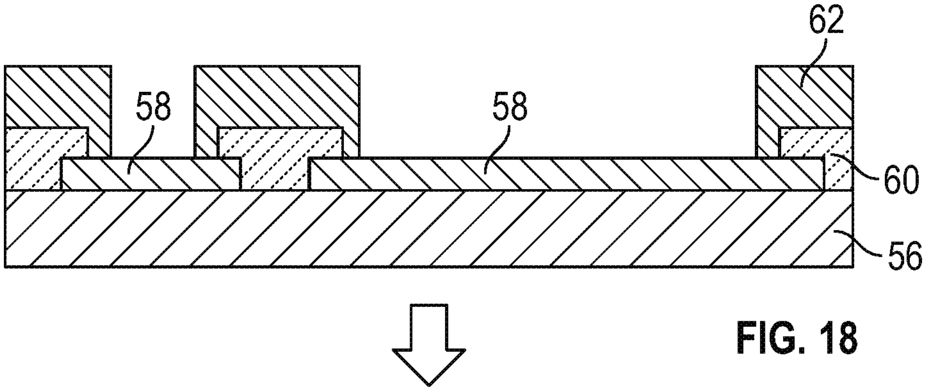
FIG. 18 is a cross sectional view of a fourth semiconductor substrate.

Various method implementations disclosed herein may be used to apply copper to one or both sides of the semiconductor substrate using electroless deposition. A method implementation that applies copper using electroless deposition is illustrated in FIGS. 18-24. FIG. 18 illustrates semiconductor substrate 56 which includes pads 58 surrounded with nitride 60 and photosensitive polyimide material 62 which act as a passivation material. The material of the pads 58 in the implementation of FIG. 18 is aluminum silicon copper. In FIG. 18, the semiconductor substrate 56 is at full thickness, or in other words, the full thickness used for processing during fabrication operations up to this point in the process.

Figure 19:
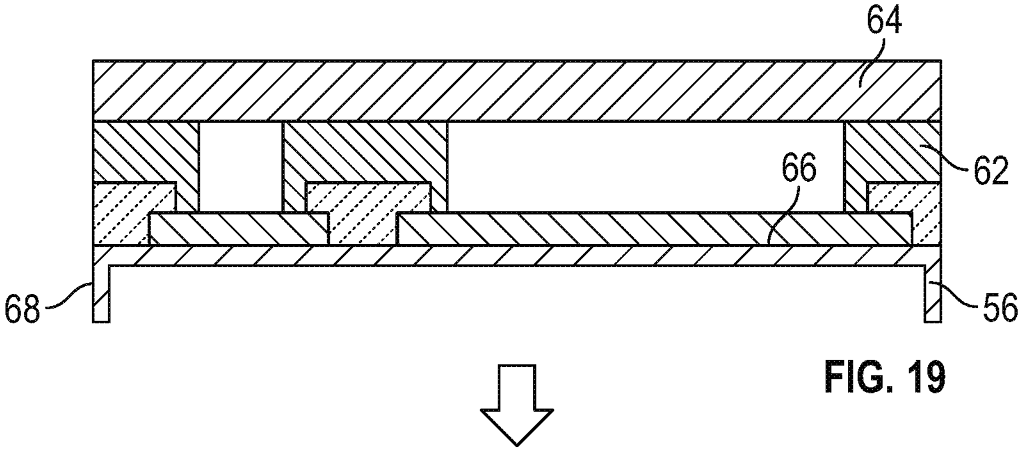
FIG. 19 is a cross sectional view of the semiconductor substrate of FIG. 18 following mounting of a carrier and a thinning operation.

Referring to FIG. 19, the semiconductor substrate 56 is illustrated following mounting of carrier 64 to the photosensitive polyimide material 62 located on the first largest surface 66 of the substrate. A thinning operation has been performed which has formed an edge ring 68 in the material of the semiconductor substrate 56. While the use of an edge ring 68 to provide support for the thinned semiconductor substrate 56 is illustrated in FIG. 19, in other method implementations, no edge ring may be used, and the mechanical support for the thinned semiconductor substrate 56 may be from the carrier 64 only.

Figure 20:
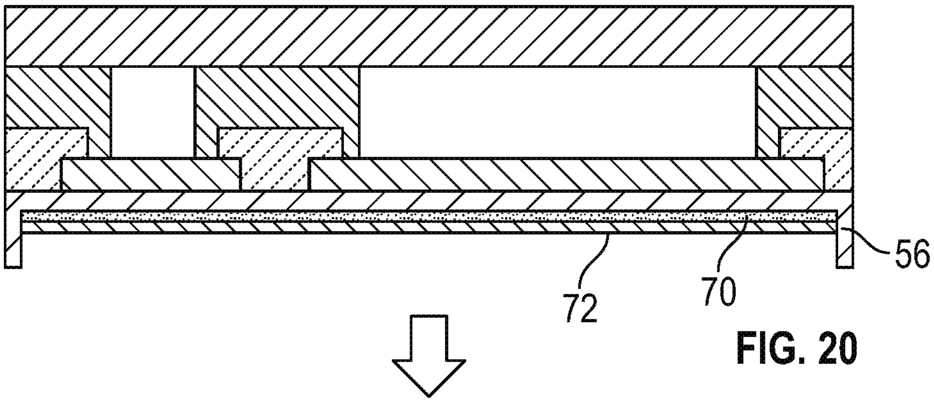
FIG. 20 is a cross sectional view of the semiconductor substrate of FIG. 19 following application of a backmetal layer.

In various method implementations, as illustrated in FIG. 20, following thinning of the semiconductor substrate 56, additional processing steps may be carried out depending on the type of devices formed in the semiconductor substrate 56 and/or the material of the semiconductor substrate 56. These may include, by non-limiting example, stress relief etching, back ion implants into the thinned material of the semiconductor substrate 56, laser annealing, backmetal formation, or any other desired processing of or from the thinned side (second largest planar side 70) of the semiconductor substrate 56. Here in the implementation illustrated in FIG. 20, a backmetal layer 72 in the form of aluminum copper has been applied via sputtering to the second largest planar side 70 in the form of two layers of material. While the use of sputtering to apply the backmetal layer has been illustrated here, where dual sided electroless deposition is employed, sputtering or another metal deposition process may only be used to create a seed or barrier layer over the second largest planar side 70 prior to electroless deposition.

Figure 21:
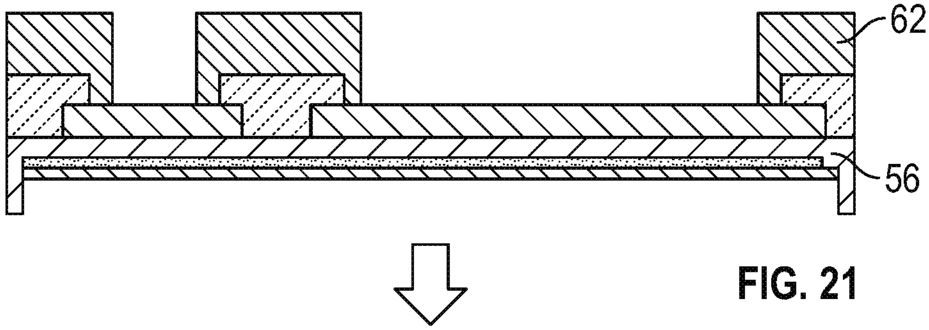
FIG. 21 is a cross sectional view of the semiconductor substrate of FIG. 20 following removal of the carrier.
Figure 22:
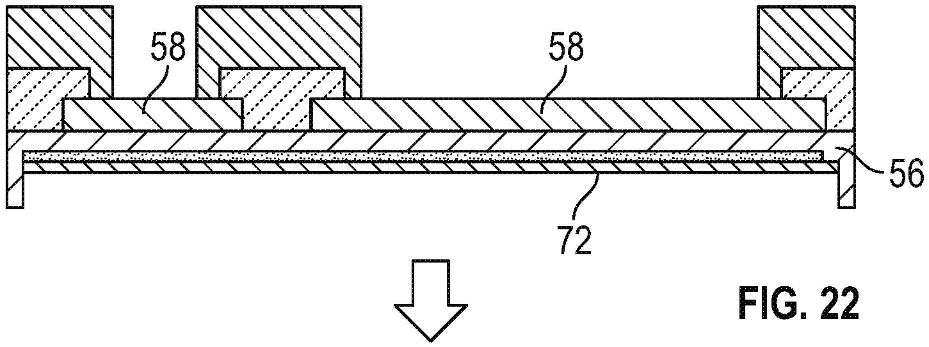
FIG. 22 is a cross sectional view of the semiconductor substrate of FIG. 21 following additional processing steps to prepare the semiconductor substrate for electroless deposition.

Referring to FIG. 21, the semiconductor substrate 56 is illustrated following demounting/decoupling of the carrier 64 from the photosensitive polyimide 62. After removal of the carrier 64, in various method implementations, additional processing steps may be employed to clean the pads 58 and/or the backmetal layer 72 for subsequent electroless deposition. These additional steps may include, by non-limiting example, precleaning (wet or dry), metal annealing, one or two-sided metal ashing, any combination thereof or any other processing of the metal layers or exposed material of the semiconductor substrate. FIG. 22 illustrates the semiconductor substrate 56 following these additional processing steps.

Figure 23:
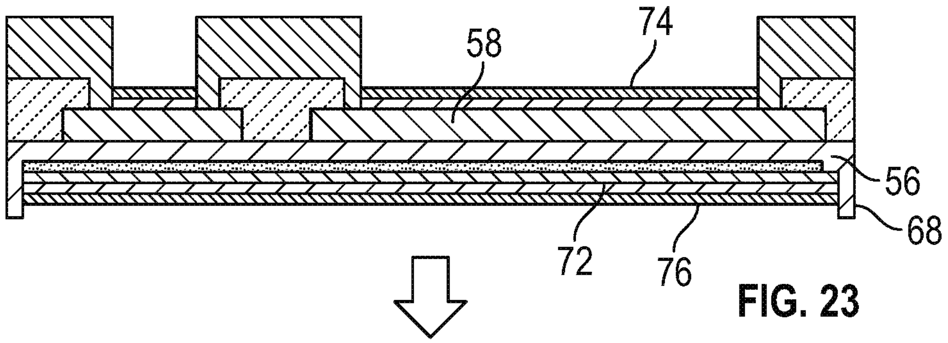
FIG. 23 is a cross sectional view of the semiconductor substrate of FIG. 22 following dual sided electroless deposition.

Referring to FIG. 23, the semiconductor substrate 56 is illustrated following dual sided electroless deposition of copper layers 74, 76 onto pads 58 and the backmetal layer 72, respectively. This electroless deposition process may be carried out using any disclosed in this document. Following the electroless deposition process, a bake process like any disclosed in this document was used to drive off any remaining plating chemicals and prepare the semiconductor substrate 56 for additional processing.

Figure 24:
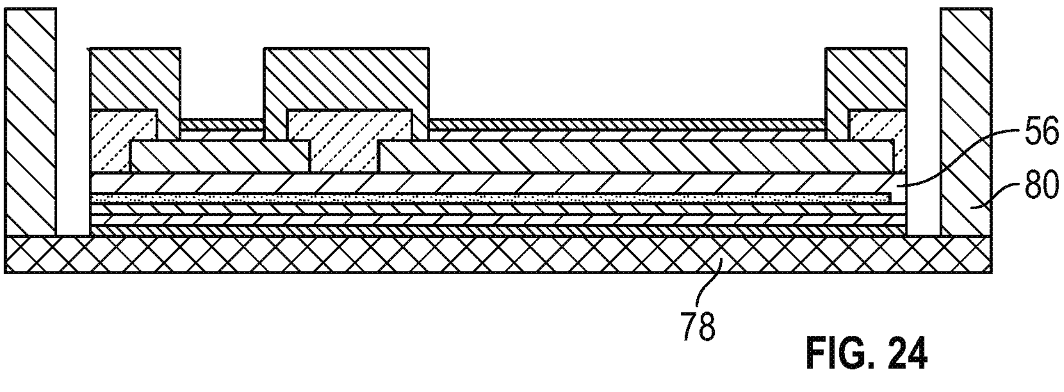
FIG. 24 is a cross sectional view of the semiconductor substrate of FIG. 23 following removal of the edge ring and mounting to cutting tape in preparation for singulation.

Referring to FIG. 24, the semiconductor substrate 56 is illustrated following removal of the edge ring 68 and mounting to cutting tape 78 attached to frame 80. The semiconductor substrate 56 is now ready for singulation using a sawing process or a combined lasering/sawing or water jet cutting/sawing process. However, in various method implementations, sawing may not be used and any of the other singulating methods may be employed either alone or in combination.

The foregoing examples of the use of a baking process with an electroless deposition process of a wide variety of metal layers are merely illustrative. Those of ordinary skill will readily appreciate how to utilize these principles to form many different metal layer combinations with many different device types for many different semiconductor substrates.

In places where the description above refers to particular implementations of methods of electroless deposition and implementing components, sub-components, methods and sub-methods, it should be readily apparent that a number of modifications may be made without departing from the spirit thereof and that these implementations, implementing components, sub-components, methods and sub-methods may be applied to other electroless deposition methods.

What is claimed is:

1. A method of electroless deposition comprising:

providing a semiconductor substrate comprising a first largest planar surface and a second largest planar surface;

forming a backmetal layer on the second largest planar surface;

attaching a tape over the backmetal layer;

electroless depositing a metal layer on a pad comprised on the first largest planar surface;

after electroless depositing, removing the tape;

after removing the tape, baking the semiconductor substrate; and removing the semiconductor substrate from an oven performing the baking when the semiconductor substrate has cooled to less than 50 C.

2. The method of claim 1, further comprising singulating the semiconductor substrate to form a plurality of semiconductor die.

3. The method of claim 1, wherein the semiconductor substrate comprises silicon carbide.

4. The method of claim 1, wherein the metal layer comprises one of nickel, palladium, and gold; nickel and copper; or only copper.

5. The method of claim 1, wherein baking the semiconductor substrate further comprises heating from ambient temperature to between 150 C to 350 C at a temperature ramp of less than or equal to 3 C per minute.

6. The method of claim 5, wherein baking the semiconductor substrate further comprises heating in a nitrogen atmosphere.

7. A method of electroless deposition comprising:

providing a semiconductor substrate comprising a first largest planar surface and a second largest planar surface;

coupling a carrier to the first largest planar surface;

thinning the semiconductor substrate from the second largest planar surface to form an edge ring;

forming a backmetal layer on the second largest planar surface;

demounting the carrier from the first largest planar surface;

electroless depositing a metal layer on a pad comprised on the first largest planar surface and on the backmetal layer;

baking the semiconductor substrate; and removing the semiconductor substrate from an oven performing the baking when the semiconductor substrate has cooled to less than 50 C.

8. The method of claim 7, further comprising mounting the semiconductor substrate to a cutting tape, removing the edge ring, and singulating the semiconductor substrate to form a plurality of semiconductor die.

9. The method of claim 7, wherein the semiconductor substrate comprises silicon carbide.

10. The method of claim 7, wherein the metal layer comprises one of nickel, palladium and gold; nickel and copper; or only copper.

11. The method of claim 7, wherein baking the semiconductor substrate further comprises heating from ambient temperature to between 150 C to 350 C at a temperature ramp of less than or equal to 3 C per minute in a nitrogen atmosphere.

* * * * *